(12) United States Patent
Kaito

(10) Patent No.: US 6,544,897 B2
(45) Date of Patent: Apr. 8, 2003

(54) METHOD FOR FORMING A VERTICAL EDGE SUBMICRON THROUGH-HOLE AND A THIN FILM SAMPLE WITH THIS KIND OF THROUGH-HOLE

(75) Inventor: Takashi Kaito, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/001,332

(22) Filed: Oct. 26, 2001

(65) Prior Publication Data

US 2002/0081507 A1 Jun. 27, 2002

(30) Foreign Application Priority Data

Oct. 31, 2000 (JP) ......................................... 2000-333369

(51) Int. Cl.[7] ............................................. H01L 21/311
(52) U.S. Cl. ........................................ 438/710; 438/692
(58) Field of Search ................................ 438/710, 692; 702/95, 157

(56) References Cited

U.S. PATENT DOCUMENTS

| 5,166,556 | A | * | 11/1992 | Hsu et al. .................... 307/465 |
| 5,504,340 | A | * | 4/1996 | Mizumura et al. ...... 250/492.21 |
| 5,741,557 | A | * | 4/1998 | Corbin et al. ................. 427/469 |
| 5,962,341 | A | * | 10/1999 | Ito .............................. 438/692 |
| 5,973,295 | A | * | 10/1999 | Corbin et al. ................. 219/229 |
| 6,263,292 | B1 | * | 7/2001 | Fiekowsky ..................... 702/95 |
| 6,303,014 | B1 | * | 10/2001 | Taylor et al. ................. 205/103 |
| 6,305,072 | B1 | * | 10/2001 | Yoda et al. ............... 29/603.14 |
| 6,397,165 | B1 | * | 5/2002 | Fiekowsky ................... 702/157 |

* cited by examiner

Primary Examiner—John F. Niebling
Assistant Examiner—Olivia Luk
(74) Attorney, Agent, or Firm—Adams & Wilks

(57) ABSTRACT

A method for forming a vertical edge submicron through-hole comprises the steps of; forming a hole on a sample thin film with a larger diameter than design size of a through-hole, with a bottom having a thickness close to the design size remaining, by etching using a focused ion beam device; forming a through-hole with the design size on the bottom section by focused ion beam etching; and backfilling the large hole to the design size by deposition using a focused ion beam device.

10 Claims, 5 Drawing Sheets

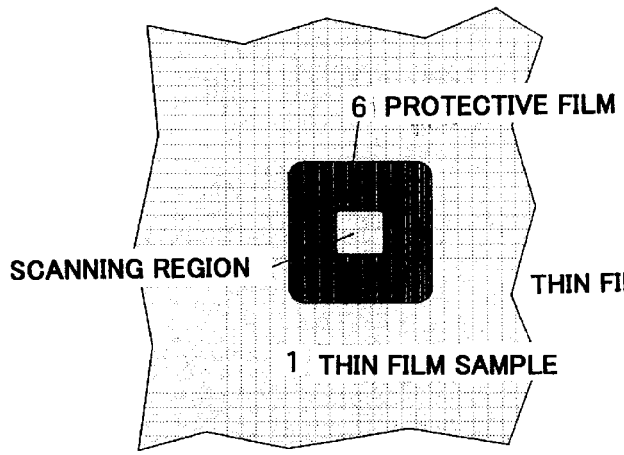
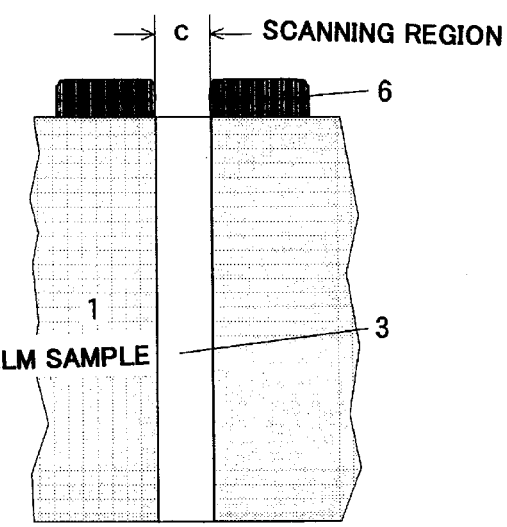
FIG. 2A
FIG. 2B

METHOD FOR FORMING A VERTICAL EDGE SUBMICRON THROUGH-HOLE AND A THIN FILM SAMPLE WITH THIS KIND OF THROUGH-HOLE

BACKGROUND OF THE INVENTION

This invention relates to a method for forming a through-hole on a mask, especially a stencil mask of an electron beam stepper, used for forming a desired pattern by projection on a semiconductor wafer or the like.

Conventionally, as a method for forming a through-hole on a stencil mask such as a silicon thin film, sputtering etching or gas assisted etching using a focused ion beam device as shown in FIG. 5 is carried out. Specifically ions are drawn out from an ion source 10 such as liquid gallium, accelerated by focusing into a beam through an ion optical system 11, and irradiated while scanning a sample on a sample stage 15 by deflecting so that etch processing is carried out. However, a through-hole in this method becomes a cone-shaped hole due to etching through a wide area on the surface of the side where a focused ion beam 12 is irradiated. If a square region is set to be scanned by beam irradiation, the hole is formed in an inverted pyramid shape as shown in FIG. 4B, which shows a view from the side where an ion is irradiated and FIG. 4A shows a cross-section thereof. Even if the scanning region shown in the drawing is set and an etching process is carried out a through-hole H then corresponds to the scanning region at the back surface, and the opening at the side where an ion is irradiated becomes a sloping S shape. This is because if ions focused into a beam by an optical system 11 are irradiated, in reality, it is a Gaussian distribution, so the periphery of the beam is also influenced by weak ion irradiation and this causes a side irradiated with a focused ion beam to be exposed to the irradiation for a long time resulting up to beyond the set region. Theoretically speaking, it is difficult to excavate a deep hole with a sputtering process using a focused ion beam 12 involving re-attachment. That is, there is a limit to irradiating a focused ion beam 12 into the deep inner part of a small hole and eliminating sputtered material from outside of the hole without re-attachment. The limit is such that a 0.3 $\mu$m through-hole (aspect ratio:5) is formed in a thin film having a thickness of 1.5 $\mu$m.

It is difficult to process a hole of much higher aspect ratio even if a gas assisted etching technique where an assisted ion beam 12 is irradiated while gas is sprayed from a gas gun 14 is employed to process in order to avoid re-attachment. Further, the slope of the opening surface has nonuniformity of a sample thin film thickness which cause a problem that, when using an electron beam stepper or the like as a stencil mask, electron diffusion becomes non-uniform and this is not suitable for a stencil.

The object of the present invention is to provide a processing method capable of forming a vertical edge through-hole on a thin film of a stencil mask such as an electron beam stepper, the hole having a small diameter with respect to the thickness of the thin film, and this kind of stencil mask.

SUMMARY OF THE INVENTION

In this invention, a method for forming a vertical edge submicron through-hole comprising the steps of; forming a large hole, in a thin film sample, with a diameter larger than a design size of a through-hole, with a bottom having thickness close to the design size remaining, by etching using a focused ion beam device; forming a through-hole having the design size in the bottom section by focused ion beam etching; and backfilling the large hole to the design size by deposition using a focused ion beam device, and another forming method is further adopted comprising the step of finishing the inner surface of the through-hole by gas assisted etching using a focused ion beam device.

BRIEF DESCRIPTION OF THE DRAWINGS

FIGS. 2A, 2B is a view showing another embodiment of the present invention for forming a submicron through-hole with a vertical edge. FIG. 2A is a plan view showing an early stage of protective film formation. FIG. 2B is a sample cross-section after being processed.

FIG. 3A is a view from an irradiation side and FIG. 3B is a cross-section.

FIG. 4A is a cross-section and FIG. 4B is a view from an irradiation side.

DETAILED DESCRIPTION OF THE INVENTION

The present invention has been conceived in consideration of the fact that with a through-hole forming method of the related art, it is impossible to form a narrow hole having a vertical edge with a large aspect ratio representing a proportion of a thickness of a membrane which is a workpiece, and is directed to a method, wherein, first, a rough hole is formed of a large diameter based on a design value of a through-hole diameter with a thin bottom remaining about the same size as the design through-hole diameter, and the hole is then buried so that the diameter finally becomes the same size as the design value by adopting a deposition technique. In this case, the bottom is left as a foundation is necessary to perform deposition and the thickness of the bottom is thin so as to make the aspect ratio smaller in order to process a narrow vertical edge through-hole on that part.

Figure 1A:
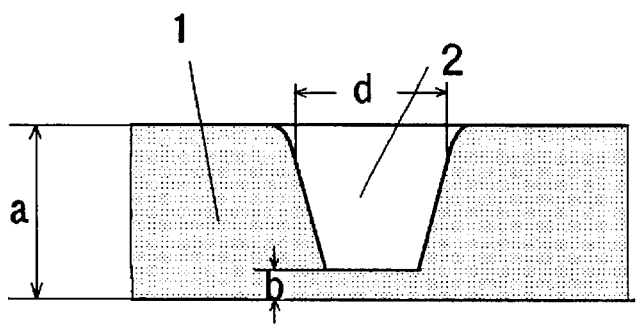
FIGS. 1A–1C is a view showing the order of forming a submicron through-hole with a vertical edge with 1A, 1B and 1C being shown on time series.
Figure 1B:
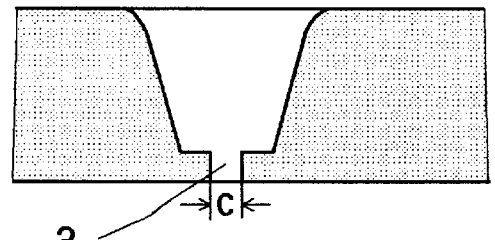
Figure 1C:
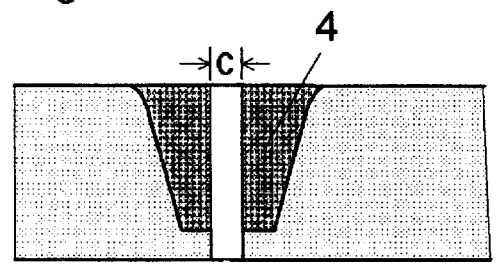

First, a focused ion beam is irradiated from the surface of a sample thin film 1 to form a hole with a large diameter d as shown in FIG. 1A using a scanning focused ion beam device. Subsequently, a focused ion beam is irradiated to the bottom of the thin part b in the order of hole diameter to process a through-hole with a diameter c corresponding to the design value by sputter etching. This aspect ratio is b/c, approximately 1. Because this processing is executed for the bottom with a thickness b which is equivalent to a hole diameter c, it is a shallow hole processing with less re-attachment, and the surface is not susceptible to exposure to long term beam irradiation so that a vertical edge type of through-hole as shown in FIG. 1B is formed. With respect to a backfilling process for the large hole dug roughly, in the atmosphere where an aromatic series gas such as phenanthrene is injected from a gun, carbon is attached to make a backfilling section 4 by irradiating a focused ion beam. At this time, by taking the region of a large hole 2, except for a design region for a through-hole, to be an irradiation region of a focused ion beam, deposition (backfilling section 4) is performed on the section other than a section for a small diameter through-hole designed as shown in FIG. 1C. For this irradiation region setting, a method wherein, when a large hole region is taken to be a scanning region and a beam scans a central section constituting a through-hole, a beam is cut off by a blanker, and also another method, for setting a number of scanning regions other than a central region constituting a through-hole and executing deposition sequentially, are adopted. At this stage, a through-hole close to a design value is formed on a sample thin film, and using the latest techniques, the inner surface is edged sufficiently vertical and can be used as a stencil mask as it is. With the above processing, a through-hole of a design size having a vertical edge is formed.

A method for initially forming a large hole roughly and then finally backfilling with a hole of the prescribed size left has been described above, but another different method for forming a hole having a diameter of less than ⅕ of the thickness of a sample will now be described with reference to FIGS. 2A, 2B.

First, using a focused ion beam device, an aromatic gas such as phenanthrene is injected from a gas gun a thin carbon film deposition 6 of approximately 0.1 to 0.2 μm is formed around the periphery of a region of the through-hole size designed on the surface of a sample 1, but not on that region itself. With respect to the surface of this sample 1, gas assisted etching is carried out while a beam is scanned so that a focused ion beam irradiates in a window region of the carbon deposition film, namely the region of designed through-hole size. Since this process has high aspect ratio, that is it is a process for excavation of a deep narrow hole, it is easy for re-attachement to occur, so gas assisted etching with halogen gas, is carried out, and not sputtering etching. In this way, the periphery section of a through-hole size region on the sample surface except for the through-hole region is protected with a deposition of carbon film which is not subject to assisted etching, so that the periphery region of the design size is not etched and only the region inside the design size is removed. A hole becomes deeper as assisted etching advances, but in the case of assisted etching, gas attached on a surface react with a material due to the energy of a focused ion beam and is vaporized so that the gas does not attach to the inner surface. Therefore, a through-hole with the design size diameter is finally formed, as shown in cross-section in FIG. 2B.

[First Embodiment]

One embodiment of the present invention will now be described with reference to FIGS. 1A–1C. This embodiment is processing of a stencil mask of an electron beam stepper to form a 2 μm square through-hole on a 2 μm silicon thin film.

A 0.5 μm square hole is excavated on a sample surface by sputter etching using a focused ion beam device. Due to the fact that this process is a rough excavation, it is possible to process by increasing a beam current up to about 10 pA (acceleration voltage is 30 kV) and etching rate without worrying about damage to the surface.

A large hole 2 is formed as shown in FIG. 1A by excavating until the thickness of the bottom becomes approximately 0.2 μm. This large hole 2 has 0.5 μm square beam irradiation. However, the surface side is exposed to long term beam irradiation and the size of an opening becomes larger so that the inner surface becomes a sloping surface as shown in the drawing. Next, this 0.2 μm square hole 3, which is a specified size of a through-hole, in the center part of this large hole 2 is excavated so as to also pass through to a rear surface by sputter etching, to give the embodiment as shown in FIG. 1B. With this processing, an accurate hole is formed by decreasing a beam current lower than approximately 2 pA, and decreasing etching rate.

Figure 3A:
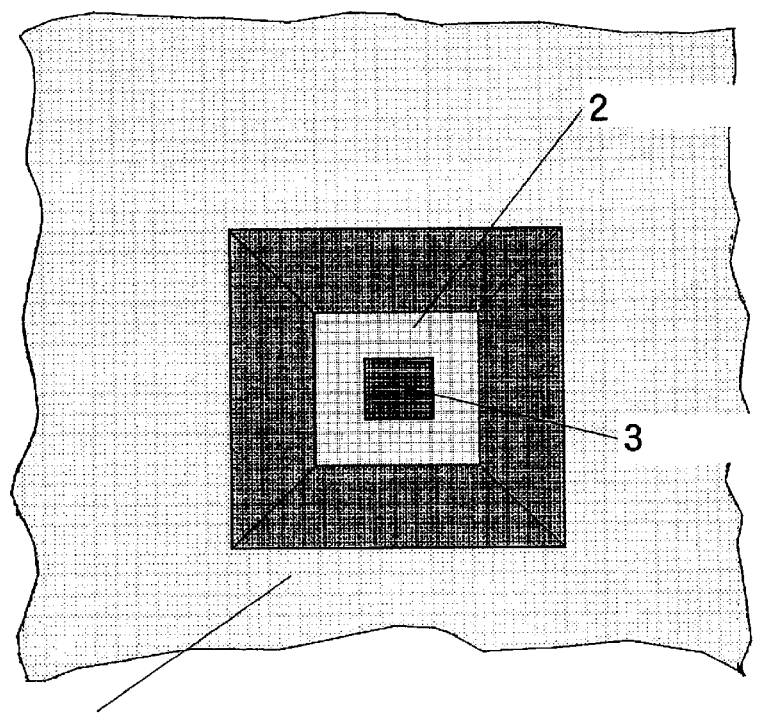
FIGS. 3A, 3B is a view schematically showing an order of backfilling large hole by deposition in the present invention.
Figure 3B:
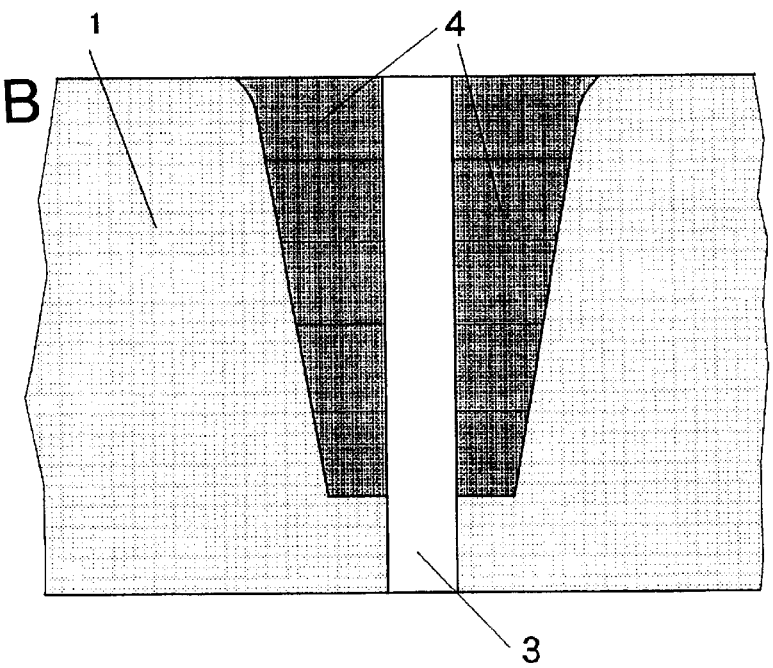
Figure 4A:
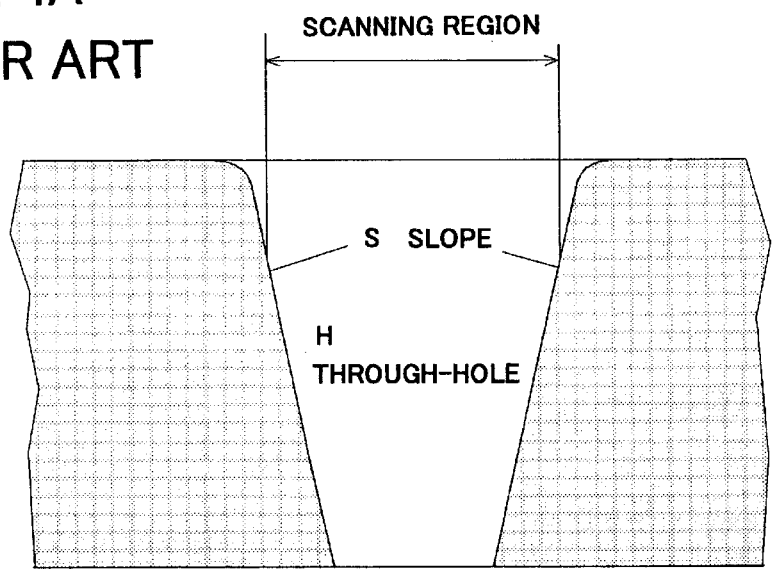
FIGS. 4A, 4B is a view showing an embodiment of processing a through-hole on a thin film with the related method.
Figure 4B:
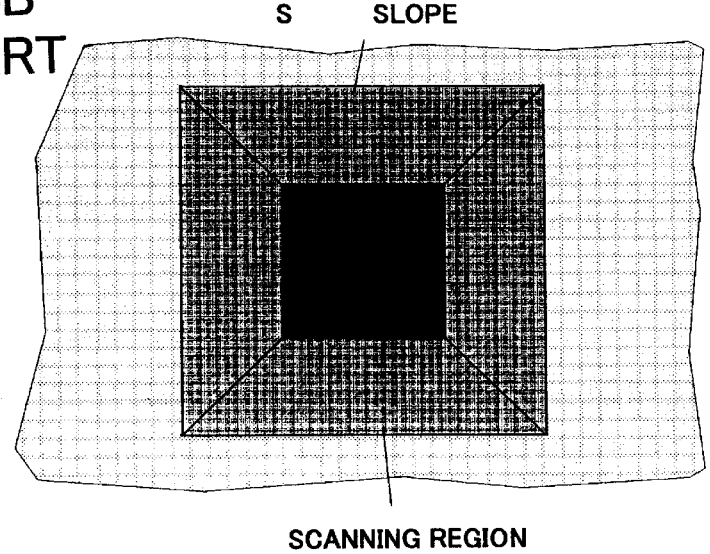
Figure 5:
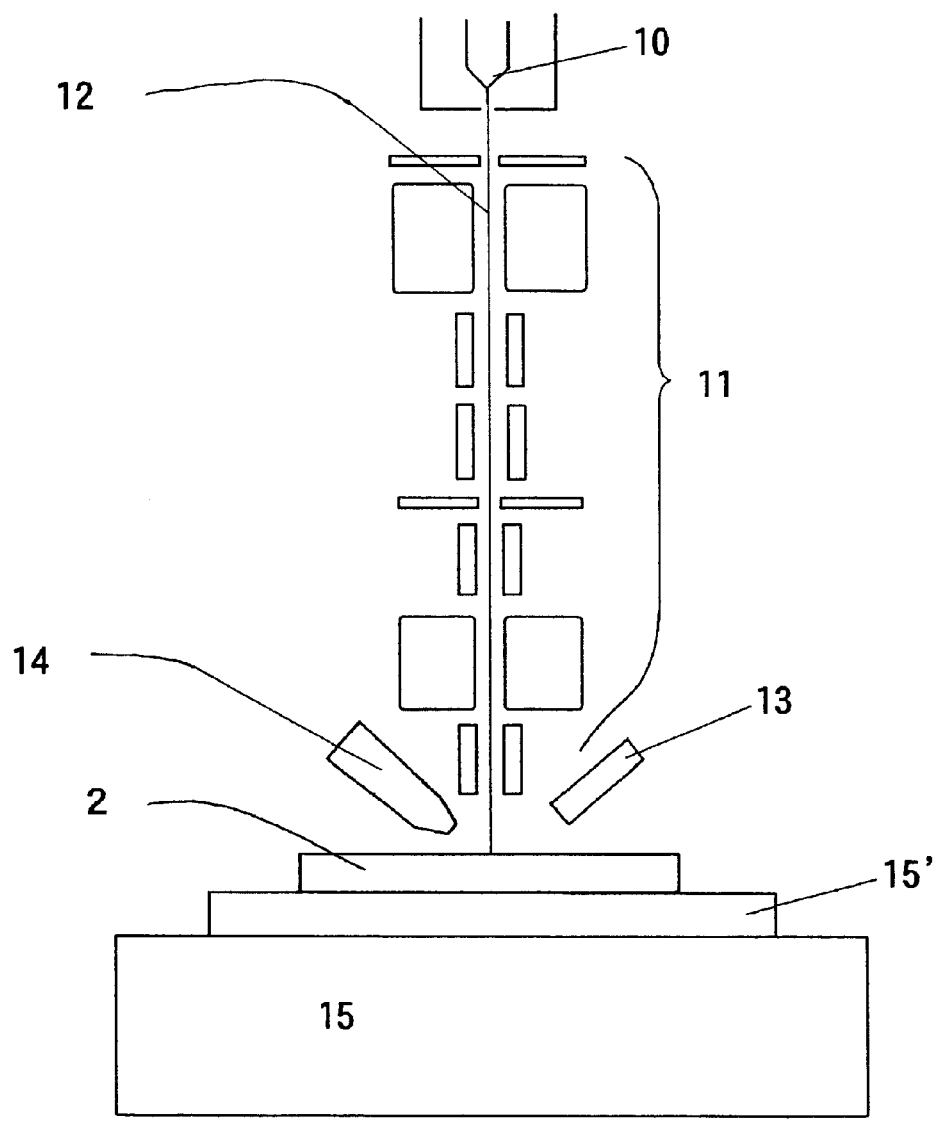
FIG. 5 is a view schematically showing the configuration of a focused ion beam device used in the present invention.

Next, with respect to a backfilling process, a gas gun injects vaporized phenanthrene by heat and a focused ion beam is irradiated to make a carbon deposition. In this embodiment, the region other than the section for a through-hole 3 as shown in FIG. 3A is designated as an ion scanning region, a relatively thin layer of about 0.2 μm is formed, the scanning region is the subject to deposition by being adjusted to the slope of the inner surface and corrected to be wider, and deposition layers are stacked up sequentially. With this operation, a through-hole 3 with a small diameter is formed as shown in a cross-section in FIG. 3B.

The present invention is a method for forming a vertical edge submicron through-hole comprising the steps of; forming a large hole, in a thin film sample, with a diameter larger than a design size of a through-hole, with a bottom having thickness close to the design size remaining, by etching using a focused ion beam device; forming a through-hole having the design size in the bottom section by focused ion beam etching; and backfilling the large hole to the design size by deposition using a focused ion beam device, so that it is possible to form a deep hole with high aspect ratio and small diameter and also possible to form a vertical edge submicron through-hole with no slope opening which is preferable for a stencil mask. The present invention also employs a method for a vertical edge submicron through-hole comprising of the steps of; forming a thick protective film around the periphery of the region for a through-hole of design size on the surface of a sample thin film except for the through-hole region by deposition using a focused ion beam device; and forming a through-hole by gas assisted etching while a focused ion beam is scanning the through-hole design region on the surface of the sample thin film. However, etching of the periphery of the through-hole opening is blocked with a protective film formed by deposition, so that processing of a vertical edge submicron through-hole can be executed efficiently.

What is claimed is:

1. A method for forming a vertical edge submicron diameter through-hole in a thin film sample, comprising the steps of: forming a large opening in the thin film sample with a diameter larger than the submicron diameter so that at a bottom section of the opening the sample has a thickness close to that of the submicron diameter by etching the sample using a focused ion beam device; forming a through-hole having the submicron diameter in the bottom section by focused ion beam etching; and backfilling the large opening to form a through-hole having the submicron diameter by deposition using a focused ion beam device.

2. A method for forming a vertical edge submicron diameter through-hole according to claim 1; further comprising the step of finishing an inner surface of the through-hole by gas assisted etching using a focused ion beam device after the step of backfilling the large opening.

3. A method for forming a vertical edge submicron diameter through-hole in a thin film sample, comprising the steps of: forming a thick protective film on a surface of the thin film sample except for a desired region of the sample having the submicron diameter size of the through-hole by deposition using a focused ion beam device; and forming a through-hole by gas assisted etching while a focused ion beam is scanning across the desired region of the surface of the thin film sample.

4. A thin film sample wherein a vertical edge submicron through-hole is formed having aspect ratio with respect to thickness of more than 5.

5. A method of forming a through-hole with a desired diameter in a sample, comprising the steps of: etching an opening in the sample with a diameter larger than the desired diameter of the through-hole such that at a bottom portion of the opening the sample has a thickness close to that of the desired diameter; etching a through-hole having the desired diameter in the sample at the bottom portion of the opening; and backfilling the opening so that the through-hole extends through the sample with the desired diameter.

6. A method of forming a through-hole according to claim 5; wherein the step of etching an opening in the sample is performed using a focused ion beam device.

7. A method of forming a through-hole according to claim 5; wherein the step of forming the through-hole in the bottom portion of the opening is performed using a focused ion beam device.

8. A method of forming a through-hole according to claim 5; wherein the step of backfilling is performed using a focused ion beam device.

9. A method of forming a through-hole according to claim 5; wherein the through-hole has a small diameter with respect to a thickness of the sample.

10. A method of forming a through-hole according to claim 5; further comprising the step of finishing an inner surface of the through-hole by gas assisted etching using a focused ion beam device after the step of backfilling the opening.

* * * * *